United States Patent [19]

Cohen et al.

[11] 4,042,730

[45] Aug. 16, 1977

[54] PROCESS FOR ELECTROLESS PLATING USING SEPARATE SENSITIZATION AND ACTIVATION STEPS

[75] Inventors: Richard Lewis Cohen, Berkeley Heights, N.J.; Ronald Lee Meek, Naperville, Ill.

[73] Assignee: Bell Telephone Laboratories, Incorporated, Murray Hill, N.J.

[21] Appl. No.: 671,034

[22] Filed: Mar. 29, 1976

[51] Int. Cl.$^2$ .............................................. C23C 3/02
[52] U.S. Cl. .................................. 427/305; 427/306; 427/98
[58] Field of Search ................. 427/305, 306, 98, 304

[56] References Cited

U.S. PATENT DOCUMENTS

| | | | |
|---|---|---|---|
| 3,011,920 | 12/1961 | Shipley | 427/304 |
| 3,674,550 | 7/1972 | Mallory | 427/306 |
| 3,694,250 | 9/1972 | Grunwald et al. | 427/305 |

OTHER PUBLICATIONS

Goldie, Metallic Coating of Plastics, Electrochemical Pub. Ltd., 1968, vol. 1, Chapter 5.
McDermott, Plating of Plastics with Metals, Noyes Data Corp., 1974, Chapter 1.
Journal of Electrochemical Soc., vol. 122, p. 1478, 1975, vol. 120, p. 1241, 1973.
Lowenheim, Moder Electroplating, 3rd Ed., 1974, p. 645.

*Primary Examiner*—Ralph S. Kendall
*Attorney, Agent, or Firm*—Walter G. Nilsen

[57] ABSTRACT

A process is described for the electroless deposition of metals on nonmetallic surfaces. After pretreatment of the nonmetallic surface so as to obtain a finish suitable for deposition of sensitizers and activators, the nonmetallic surface is exposed to a sensitizing solution and thereafter in a separate step to an activation solution. The surface is then washed with an aqueous alkaline solution prior to immersion in the electroless plating solution. The separate sensitization and activation steps are particularly suitable where the sensitizing step is also used for pattern generation. The inclusion of the aqueous alkaline wash after the activation step both protects the electroless plating bath from contamination with sensitizer and activator, and also insures a short initition time. Short initiation times are highly desirable especially in the production of electronic circuits because highly uniform metal platings are insured, manufacturing time is considerably reduced and reliability is increased.

10 Claims, 2 Drawing Figures

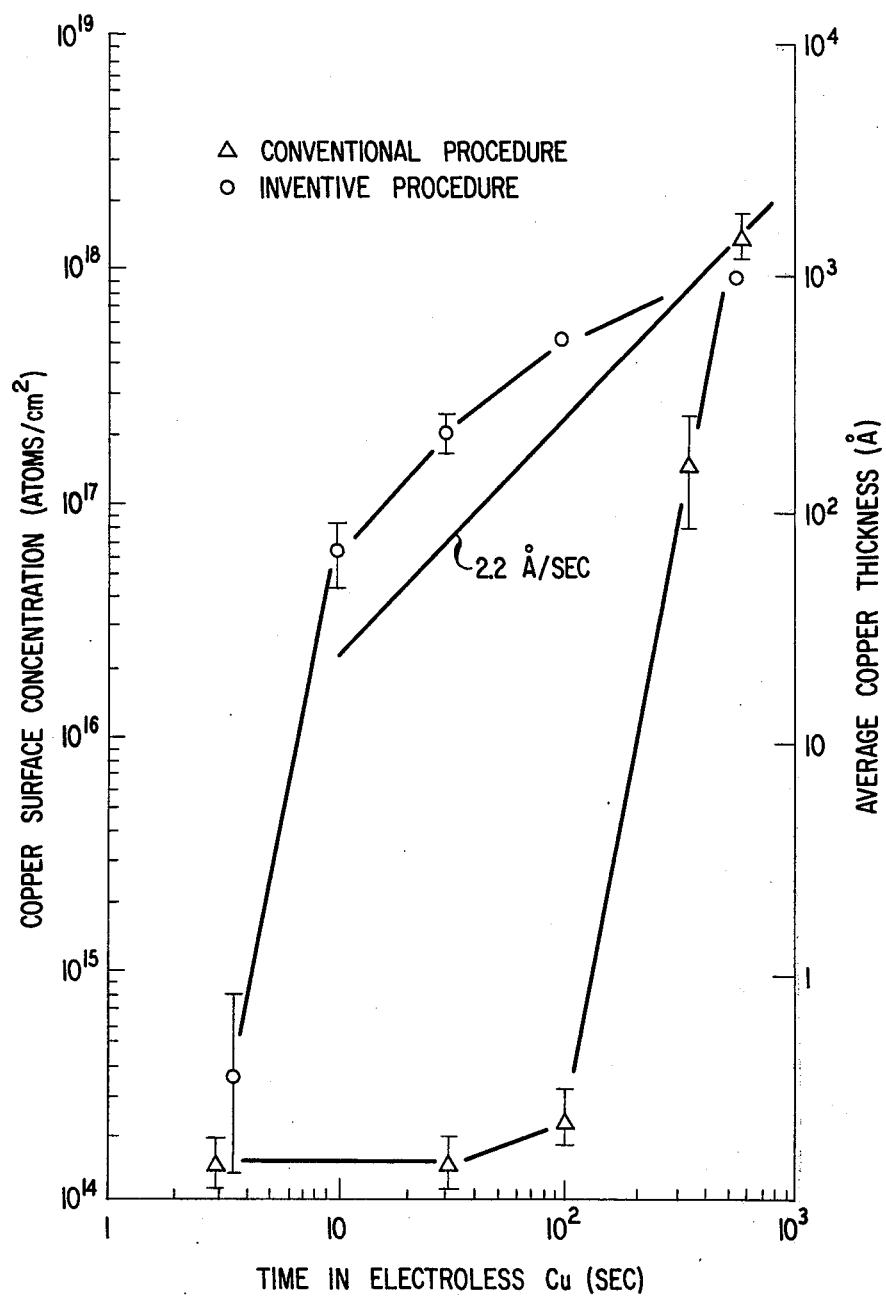

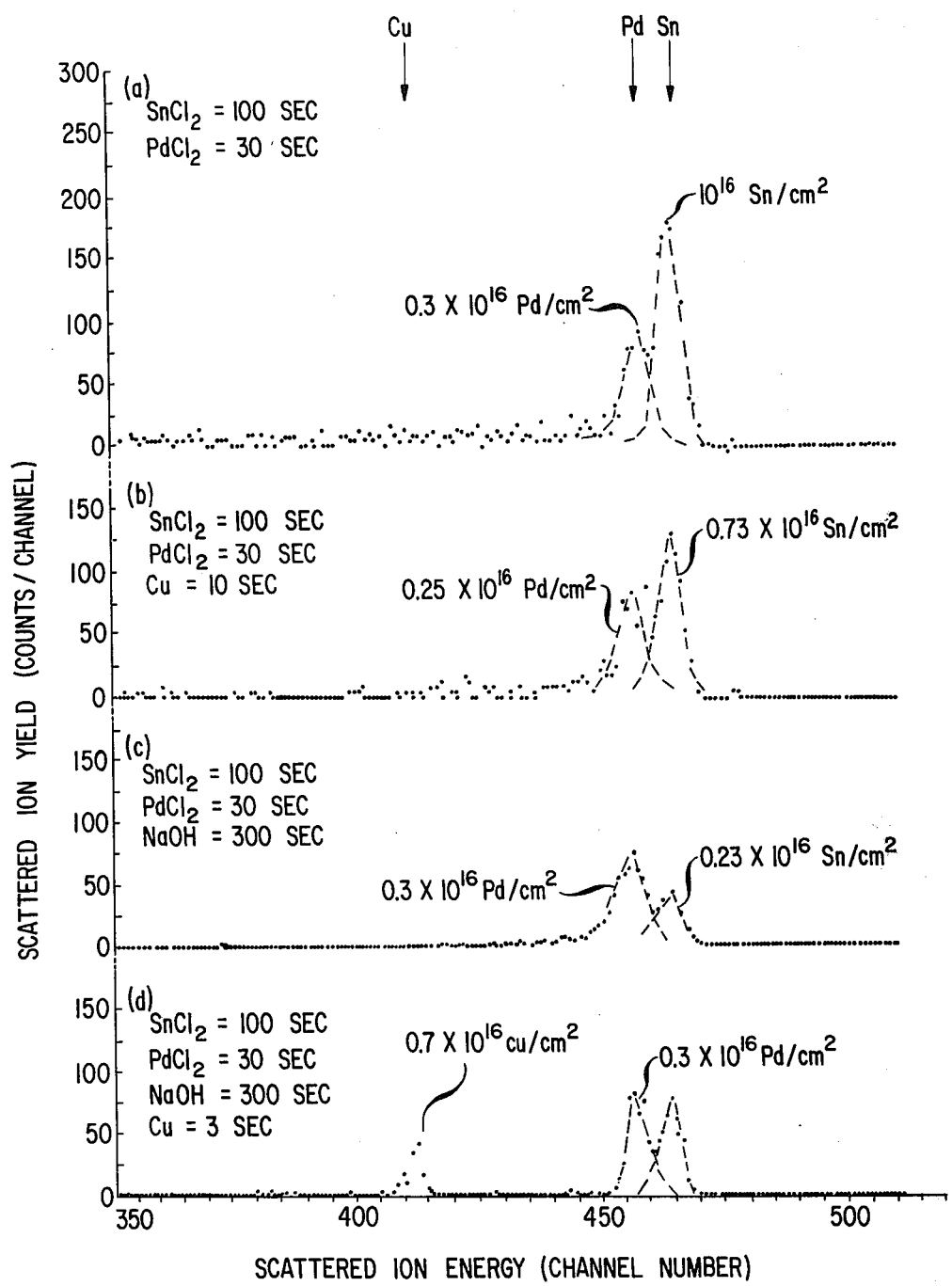

PROCESS FOR ELECTROLESS PLATING USING SEPARATE SENSITIZATION AND ACTIVATION STEPS

BACKGROUND OF THE INVENTION

1. Field of the Invention

The invention is a process for the electroless deposition of metals on nonmetallic surfaces. It involves in particular the sensitization and activation of the nonmetallic surface of electroless metal disposition.

2. Description of the Prior Art

Electroless deposition of metals on nonmetallic surfaces (i.e., polymer surfaces and ceramic surfaces) has become of increasing importance in recent years. An increasingly large variety of electronic circuits is now manufactured on printed wiring boards made up of nonmetallic surfaces which have been metallized to provide conducting paths. Electroless deposition of metals on nonmetallic surfaces is also used for decorative plating on such articles as automobile parts, consumer appliances, etc. Inexpensive and reliable processes for carrying out such electroless plating procedures are in great demand. It is highly desirable from an economic point of view to develop inexpensive, simple and highly reliable processes for electroless plating of metals on nonmetallic surfaces. For applications relating to the fabrication of electronic circuits good control over the deposition process is often required. For example, rapid and uniform initiation of electroless deposition assures more uniform deposition of metal which is highly advantageous for printed circuit boards to be used in electronic circuit fabrication.

An important part of the process for electroless deposition of metals on nonmetallic surfaces is the preparation of the nonmetallic surface to make it catalytic for electroless deposition. A variety of processes is in use for making the nonmetallic surface catalytic for electroless deposition. Particularly important is the so-called two-step process in which the nonmetallic surface is first exposed to a sensitizer solution (typically $SnCl_2$) and then in a separate step exposed to an activator solution (typically $PdCl_2$). The two-step process often gives superior results for particular surfaces and electroless deposition solutions and is preferred where a sensitizer solution is used for pattern delineation. A review of catalytic activation procedures using the two-step process may be found in a book entitled *Metallic Coating of Plastics* by William Goldey, Electrochemical Publications Ltd. 1968, Volume 1, particularly Chapter 5.

The increased sophistication of electronic circuits has increased the demands for more precise control of the electroless deposition process. Particularly important are uniform thickness and more precise pattern delineation. Attainment of these goals is aided by reducing or eliminating initiation times usually evident in electroless deposition processes. Additionally, decreased wash-in of sensitizer and activator materials into the electroless plating bath is highly desirable, as these substances have deleterious effects on bath stability.

SUMMARY OF THE INVENTION

The invention is a process for electroless plating of copper on nonmetallic surfaces in which there is a separate sensitization and activation step. Of particular significance is the use of a post-activation treatment involving exposure of the surface to an aqueous alkaline solution prior to electroless plating with copper. A variety of alkaline solutions may be used, including alkali hydroxides such as sodium hydroxide and other bases such as ammonium hydroxide. Although concentrations may extend over a wide range, the concentration range from 0.02 molar to 0.2 molar is particularly convenient where limited processing time is required. Care must be used in the choice of the time of treatment, the concentration range of base in the alkaline solution, the particular alkaline agent used so as to avoid removing the sensitizing colloidal material. For example, treatment with excessively concentrated aqueous potassium hydroxide sometimes removes the sensitizing colloidal material. Although rapid treatment would usually minimize this problem, under some circumstances, particularly commercial production of electroless metal coatings, the process might not be under sufficient control to be preferred. The sensitization and activation steps are conventional and preferably use $SnCl_2$ for sensitization and $PdCl_2$ for activation. Electroless plating procedures carried out in accordance with the inventive process yield more rapid electroless deposition with very short initiation times and with less loss of palladium and tin into the electroless copper bath.

BRIEF DESCRIPTION OF THE DRAWING

FIG. 1 shows a graph of data plotted on coordinates of surface concentration of copper vs. time in the electroless copper solution which demonstrates the faster initiation of copper deposition in the inventive procedure compared to conventional procedures; and FIG. 2 shows Rutherford backscattering data on sensitized graphite surfaces using a conventional procedure and the inventive process.

DETAILED DESCRIPTION

The invention involves a specific procedure for the electroless deposition of copper on nonmetallic surfaces. Generally, the nonmetallic surfaces are made of plastic for polymers, but other nonmetallic surfaces including wood, paper, mica, glass, ceramics, etc. may also be used. For convenience in outlining the specific procedure, the process may be divided into a sequence of steps as follows:

a. Physical and chemical preconditioning of the surface so as to permit good adhesion of the catalyst and metal plating to the nonmetallic surface.

b. Application of sensitizer solution to the nonmetallic surface.

c. Application of an activator solution.

d. Application of an alkaline solution.

e. Application of electroless copper plating solution.

The procedure outlined above will now be discussed in more detail.

1. Preconditioning of the Surface

The procedure used to precondition the surface to be plated depends largely on the nature of the surface. The purpose of this part of the electroless disposition procedure is physically and chemically prepare the surface for the sensitizer and activator solutions so as to insure good adhesion of the electroless plating to the nonmetallic surface. Generally, this preconditioning procedure involves a cleaning step to remove organic contaminants from the surface and an etching step to provide some amount of roughening of the surface and to prepare the surface chemically for the sensitizing and activating solutions.

A particular procedure for an epoxy surface will serve to illustrate this part of the electroless deposition process. This type of procedure is usually called a swell-etch procedure, in which a solvent which is highly absorbed by the surface (e.g., methylethylketone, furan) is used to swell the surface. After swelling, an acid etch solution (e.g., chromium trioxide and sulfuric acid) is used to etch the surface. Generally the etching step is carried out at elevated temperatures (50°–100° C) and a water rinse is used between the swelling and etching steps and after the etching step.

Other surface treatments have been described in a book by John McDermott (Plating of Plastics with Metals, Noyes Data Corporation, Park Ridge, N.J., 1974 especially chapter 1) and a book by William Goldie (Metallic Coating of Plastics, Electrochemical Publications Limited, 1968, Vol. I and II).

2. Sensitization

Sensitization may be carried out with a variety of agents well known in the art such as stannous compounds, etc. Stannous chloride acidified with hydrochloric acid to prevent hydrolysis yields the best and most consistent results. Although the concentration of stannous chloride may vary 0.2 grams per liter to 100 grams per liter and the concentration of hydrochloric acid from 1 ml per liter to 200 ml per liter, the preferred ranges are 1 to 20 grams per liter stannous chloride and 10 to 60 ml per liter hydrochloric acid. Times of exposure of the nonmetallic surface to the sensitizing solution may also vary over large limits and are generally longer for less concentrated solutions but a range from approximately 10 seconds to 5 minutes is preferred because of convenience in commercial manufacturing procedures. After this sensitizing step the surface may be washed with water preferably for a period of 10 seconds to 5 minutes. The water wash is not required to make the process work but prevents contamination of the various solutions thus prolonging their useful life.

3. Activation

Activation may be carried out in a variety of ways using a noble metal to insure the presence of a thin catalytic layer on the nonmetallic surface. The noble metal may be gold, platinum, palladium, silver, etc. Particular forms of the noble metal are hydroxide complexes such as $HAuO_3^=$, $Pt(OH)_6^=$, $Pd(OH)_6$, etc. Particularly useful is palladium especially in the form of an aqueous solution of palladium dichloride acidified generally with hydrochloric acid. A typical solution has between 0.02 grams per liter to 2 grams per liter palladium dichloride and 0.02 ml per liter to 20 ml per liter hydrochloric acid. Generally the procedure is carried out at approximately room temperature, although elevated temperatures are helpful where very dilute solutions are used. The time of exposure may vary typically between 10 seconds and 5 minutes. Approximately 30 seconds to 1 minute is sufficient in most cases. After exposing the nonmetallic surface to the activation solution the surface may be washed with water, preferably for a period of 10 seconds to 5 minutes. Again the water rinse is not vital to the process but prevents contamination of various solutions which prolongs their useful life.

4. The Alkaline Rinse

After activation the surface should be treated with an alkaline solution to be described below prior to exposure to the electroless copper-plating solution. Various alkaline agents may be used, but it is preferred that their alkaline strength as measured by the dissociation constant for the production of the first OH− ion be at least $10^{-5}$. Preferred bases are sodium hydroxide and ammonium hydroxide, both because of their ready availability and ease with which they can be removed from surfaces. Weaker bases might be satisfactory for some applications but the reduction in initiation time for electroless copper deposition might not be satisfactory for many applications or the exposure times required for satisfactory reduction might not be convenient for some applications. The base potassium hydroxide, especially in higher concentrations, should be avoided in most practical manufacturing situations because of the tendency of this basic reagent to remove the colloidal catalyzing layer. The basic solution of sodium hydroxide in the concentration range of 0.1 to 0.2 molar is particularly preferred because it effectively eliminates initiation time in the electroless plating procedure and is inexpensive and nonvolatile. The times of exposure may vary over large limits but times between 10 seconds and 60 minutes are convenient and yield the desired improvements. A time of approximately 5 minutes is usually used in practical applications.

5. Electroless Deposition of Copper

The electroless deposition of copper is carried out by conventional means using conventional electroless copper baths. A great variety of bath compositions and procedures may be used. Some of these are outlined in the William Goldey reference cited above, especially Chapter 6.

A typical electroless copper solution contains a copper salt such as copper sulphate, a complexing agent such as disodiumethylenediaminetetracetate or sodium potassium tartrate, a reducing agent such as formaldehyde and sufficient base such as alkaline metal hydroxide to obtain a pH of at least 11. Typical concentrations are: from 0.002M to 0.15M for the copper salt; from 0.003M to 1M for the complexing agent; and from 0.02M to 2M for the reducing agent. The time that the surface should be exposed to the electroless plating solution may vary over large limits depending generally on plating conditions and thickness desired. Plating times as short as 10 seconds may be sufficient to obtain the desired thickness so that electrolytic copper deposition may be used subsequently to increase thickness. Times exceeding one hour are usually not profitable because the increase in plating thickness obtained after one hour is usually not particularly profitable. Although the electroless copper procedure is most conveniently carried out at room temperature, elevated temperatures up to the boiling point of the electroless solution may be useful at times.

6. Typical Procedure

A typical procedure will serve to illustrate the inventive process. A nonmetallic surface which has been preconditioned for catalytic activity is first immersed in a sensitizing solution made of 100 milliliters water, 1.6 grams $SnCl_2 2H_2O$ and 3 ml concentrated hydrochloric acid. The surface is exposed to this solution for approximately 100 seconds. The surface is then washed in water for approximately 60 seconds. The surface is then exposed to an activator solution made up of 0.02 grams $PdCl_2$, 0.8 ml hydrochloric acid and 100 ml of water. The surface is exposed to the activator solution for approximately 30 seconds. The surface is then exposed to an alkaline solution made up of 0.8 grams NaOH and 100 ml of water. This procedure is carried out for approximately 5 minutes. The surface is then rinsed again with water for approximately 60 seconds and then exposed to an electroless copper solution for approximately 10 minutes. The electroless copper plating solution is made up of 3.6 gm/l of $CuSO_4 \cdot 5H_2O$, 25 gm/l of sodium potassium tartrate, 3.8 gm/l NaOH and 10 ml per liter of 37 percent formaldehyde. The electroless copper plating procedure is carried out for approximately 10 minutes. After this step, the surface is rinsed with water for approximately 60 seconds and, if additional copper thickness is required, the surface is electroplated with copper.

7. Comparison of the New and Conventional Electroless Plating Procedures

The figures show a comparison of the electroless plating procedure using the inventive process, which incorporates an alkali rinse prior to electroless plating, and a conventional process. As can be seen, there is little or no initiation time connected with the plating using the inventive procedure. In contrast, the conventional procedure, which does not use the alkaline rinse prior to the electroless plating, requires significant initiation time before plating begins. The advantage of the inventive procedure is that shorter times are required to obtain significant and useful thicknesses of copper plating. This is particularly significant in commercial manufacturing procedures where reduced exposure time to the electroless bath is economically advantageous. Frequently, final thickness of copper is obtained by electroplating on a copper surface initially deposited by an electroless procedure. In many cases, the electroless procedure will require a substantially shorter period of time due to negligible initiation times. In addition, variations in initiation times not only from day to day but also at various parts of the surface being plated may make the thickness of the copper deposit uneven. A distinct advantage of the inventive procedure is increased reproducibility (due to elimination of the variable initiation time) so that a given time of exposure to the electroless bath consistently leads to the same copper thickness both day to day and over the entire surface being plated. This reproducibility permits thinner electroless plating (and therefore less plating time) before initiation of the copper electroplating to build up to final plating thickness.

The particular advantages of the inventive procedure are demonstrated with the help of Rutherford backscattering spectra. The backscattering technique is discussed more fully in two references: R. L. Meek, in *J. Electrochemical Soc.*, Vol. 122, p. 1478 (1975) and R. L. Meek, T. M. Buck and C. F. Gibbon, in *J. Electrochemical Soc.*, Vol. 120, p. 1241 (1973). A Rutherford backscattering spectrum of a surface is used to identify the atomic species on the surface and also is used to determine the concentration of these atomic species on the surface. The identity of the atomic species is determined from the scattered-ion energy and the surface concentration of the atomic species is determined from the area under the plot scattered-ion yield vs. scattered-ion energy.

FIG. 2 shows Rutherford backscattering spectra of 4 graphite surfaces (labeled *a*, *b*, *c* and *d*) subjected to different surface treatments. All samples were rinsed after each step. Sprectrum (*a*) is of a surface exposed to the sensitizer for 100 seconds and then to the $PdCl_2$ activator for 30 seconds. The surface yielding spectrum (*b*) had the same treatment as above plus 10 seconds exposure to a copper electroless bath. The surface giving spectrum (*c*) had the same treatment as (*a*) plus 300 seconds exposure to an aqueous NaOH solution. The surface giving spectrum (*d*) had the same sensitizing and activating treatment as the surface giving spectrum (*a*) but in addition was exposed to an aqueous NaOH solution for 300 seconds and then exposed to a copper electroless plating solution (of the same composition as used for (*b*)) for 3 seconds.

Spectrum (*a*) shows that after exposure to a sensitized solution $SnCl_2$ for 100 seconds and then an activating solution of $PdCl_2$ for 30 seconds the substrate is coated with $3 \times 10^{15}$ Pd atoms/cm$^2$ and $10^{16}$ Sn atoms/cm$^2$. Comparison of these spectra shows the advantages of the inventive process over conventional processes not using an alkaline rinse after activation and prior to electroless copper plating. Spectrum (*b*) shows the composition of the surface after being exposed to the conventional sensitizing and plating procedure whereas spectrum (*d*) shows the surface composition after following the inventive procedure including an alkali wash before electroless copper plating. Spectrum (*b*) shows no detectable copper deposition even after 10 seconds immersion in the electroless bath. In contrast, spectrum (*d*) shows detectable deposition of copper after only 3 seconds. The surface concentration of copper atoms was $0.7 \times 10^{16}$ Cu atom/cm$^2$. This experiment shows that copper electroless plating begins much sooner when the surface is sensitized and activated according to the inventive procedure and that the disadvantageous initiation time for electroless copper plating is essentially elminated.

Another advantage of the inventive process is that much fewer tin and palladium ions are lost into the electroless copper solution than using conventional processes. By comparing spectra (*a*) and (*b*) of FIG. 2, it can be seen that approximately $0.3 \times 10^{16}$ Sn atoms/cm$^2$ have left the surface and have been lost into the copper electroless bath. Somewhat smaller amounts of palladium have also been removed from the surface. A more extensive study of palladium loss into the copper electroless solution is given in the R. L. Meek reference cited above. Such tin and palladium contamination of the copper electroless solution makes the solution unstable and is essentially intolerable under commercial manufacturing conditions. (See *Modern Electroplating*, F. A. Lowenheim, ed, 3rd Edition 1974, p. 645).

Comparison of spectra (*a*) and (*c*) shows that large amounts of tin are removed during the alkaline solution rinse but none (as evidenced by comparison of spectra (*c*) and (*d*)) goes into the copper electroless bath after the alkaline solution rinse.

In summary, the Rutherford backscattering data show that the inventive process drastically reduces and eliminates initiation times for electroless copper plating and reduces or elminates the problem of contamination of the electroless bath by tin and palladium removed from the surface to be plated.

What is claimed is:

1. A process for electroless deposition of copper on nonmetallic surfaces comprising the steps of:
   a. preconditioning the nonmetallic surface so as to prepare the surface for a sensitizing and activating procedure;

b. exposing the preconditioned surface to a sensitizing solution consisting essentially of an acidified aqueous solution of tin ions;

c. activating the sensitized surface by exposing the surface to an acidified solution of palladium ions so as to produce a catalytically active surface;

d. exposing the catalytically active surface to an aqueous post-activation solution; and e. exposing said surface to an alkaline electroless copper plating solution;

characterized in that the aqueous post activation solution consists essentially of a nonreducing alkaline agent with dissociation constant for the liberation of one hydroxyl ion greater than $10^{-5}$ and concentration range from 0.07 to 0.2 molar.

2. The process of claim 1 where the alkaline agent is NaOH.

3. The process of claim 1 where the alkaline agent is ammonia.

4. The process of claim 1 where the concentration of alkaline agent is from 0.1 M to 0.2 M.

5. The process of claim 1 where the catalytically prepared surface is exposed to the aqueous post-activation solution for approximately 5 minutes.

6. The process of claim 1 where the sensitizing solution consists essentially of an aqueous solution of stannous chloride acidified with hydrochloric acid.

7. The process of claim 6 where the concentration of stannous chloride is from 1 to 20 gm/l and of concentrated hydrochloric acid is from 10 to 60 gm/l.

8. The process of claim 1 where the activating solution consists essentially of an aqueous solution of palladium dichloride acidified with hydrochloric acid.

9. The process of claim 8 in which the concentration of palladium dichloride is from 0.02 to 2 gm/l and the concentration of concentrated hydrochloric acid is from 0.02 to 20 ml/l.

10. The process of claim 1 in which the surface is electroplated with copper subsequent to electroless copper plating.

* * * * *